United States Patent
Singh et al.

(10) Patent No.: US 6,770,929 B2
(45) Date of Patent: Aug. 3, 2004

(54) METHOD FOR UNIFORM POLISH IN MICROELECTRONIC DEVICE

(75) Inventors: Rana P. Singh, Austin, TX (US); Paul A. Ingersoll, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 43 days.

(21) Appl. No.: 10/004,507

(22) Filed: Nov. 2, 2001

(65) Prior Publication Data

US 2002/0037628 A1 Mar. 28, 2002

Related U.S. Application Data

(62) Division of application No. 09/655,149, filed on Sep. 5, 2000.

(51) Int. Cl.[7] ............................................. H01L 21/8238
(52) U.S. Cl. ..................... 257/306; 257/396; 257/302; 257/330; 257/334; 257/386; 257/387; 438/225
(58) Field of Search ........................ 438/225; 257/302, 257/296, 306, 330, 334, 386, 387

(56) References Cited

U.S. PATENT DOCUMENTS 5,053,839 A * 10/1991 Esquivel et al. ............ 357/23.5
5,811,345 A    9/1998 Yu et al.
6,060,385 A    5/2000 Givens
6,103,626 A    8/2000 Kim
6,281,049 B1   8/2001 Lee
6,326,309 B2  12/2001 Hatanaka et al.
6,476,434 B1 * 11/2002 Noble et al. ................ 257/302

FOREIGN PATENT DOCUMENTS

| EP | 0545263 A2 | 6/1993 |
|----|------------|--------|
| EP | 0813239 A1 | 12/1997 |
| EP | 1094514 A2 | 4/2001 |
| JP | 10294366   | 11/1998 |
| JP | 11260907   | 9/1999 |
| JP | 2000124305 | 4/2000 |
| JP | 2000156360 | 6/2000 |

* cited by examiner

Primary Examiner—David Nelms
Assistant Examiner—Renee R Berry
(74) Attorney, Agent, or Firm—James L. Clingan, Jr.

(57) ABSTRACT

A method for achieving a uniform planar surface by a chemical mechanical polish includes surrounding an active area or array to be polished with a border of the active material such that the border is wider than a single active area within the array and is preferably spaced from the outermost active area by the same distance as the distance between active areas within the array.

10 Claims, 2 Drawing Sheets

METHOD FOR UNIFORM POLISH IN MICROELECTRONIC DEVICE

This is a divisional of application Ser. No. 09/655,149 filed Sep. 5, 2000.

FIELD OF THE INVENTION

The present invention is related to the field of fabrication of semiconductor devices and more particularly to the field of the fabrication of an area of circuitry on a substrate in which the area requires a uniform planar surface for optimal efficiency.

RELATED ART

In the process of manufacturing microelectronic devices it is a common practice to electrically isolate areas in a substrate by etching of trenches around a device or array that are subsequently filled with a dielectric material. Deposition of the dielectric material typically results in an uneven surface, particularly in that the surface contains dips over the area of the trenches. This uneven surface is typically planarized by a chemical mechanical polish (CMP) prior to further processing. Because of the mechanical properties of the pads used in the polishing process, there is a problem with "dishing," or the surface being non-uniform and more heavily polished near the edges of the device than in or near the center. Because of variations in electrical properties in a device that is not evenly polished, or that does not have a planar surface, such a device may not function properly or it may fail more quickly.

A typical memory device is made of an array of longitudinal active regions wherein the active regions are separated by substantially parallel longitudinal trenches disposed between the active areas. One solution to the problem of uneven polish on the edges of such an array has been to include dummy active regions along the edges of an array in which the dummy regions are chemically (compositionally) and spatially (geometrically) identical to the intended active regions. In this way, the nonplanar edges occur over the dummy active regions and do not affect the actual active array. A memory array such as a nonvolatile memory array that requires higher voltage and is more sensitive to the aberrations caused by a nonplanar surface may require as many as ten dummies along each edge of the array, resulting in a significant loss of usable active area on the substrate.

Another solution to the problem has been the use of dummy tiles, which are tile-shaped active regions which are arranged around the array in order to reduce the distortion at the edges of the array. The use of dummy tiles has provided better results than the use of dummy active areas, however dummy tiles must be spaced farther away from the outermost active areas than the spacing of dummy active areas. The dummy tiles are, in fact, often used in conjunction with dummy active areas. Therefore, this method does not solve the problem of the loss of unusable substrate "real estate." Thus, there is still a need for a method of reducing the distortion at the edges of an array to achieve a planar surface on a wafer or on the dice within a wafer without the loss of space on the substrate due to dummy active areas or tiles.

BRIEF DESCRIPTION OF THE DRAWINGS

The present invention is illustrated by way of example and not limitation in the accompanying figures, in which like references indicate similar elements, and in which.

DETAILED DESCRIPTION

The present invention provides an improved manner of achieving a uniform planar surface of features in a semiconductor substrate from a chemical mechanical polish process, and also provides substrates in which an area of common circuitry or common electrical properties can be planarized by a chemical mechanical polish. In the practice of the invention, a planarized surface can be achieved without the use of a large number of dummy actives on the edges of the usable substrate area, although dummy actives may still be used for purposes other than as compensation for uneven polishing along the edges of an active area. The invention also provides semiconductor substrates that contain defined regions of common circuitry and methods of producing the substrates in which the active areas along the edges of the regions may be substantially planar with the active areas in the center of the defined regions. The present invention may be applied to any area of common circuitry or of common electrical properties in which an uneven surface may be planarized by a chemical mechanical polish. For example, the disclosed methods may be applied to a substrate that contains a defined region in which active areas are separated by trenches to be filled with a dielectric material, or on which a conductive material such as a metal or aluminum-copper is deposited and etched to achieve defined active areas or circuitry. In a general sense, the invention may be used to improve the processing of any uneven surface over which a layer of material is deposited and planarized by a chemical mechanical polish. Examples of such embodiments include, but are not limited to DRAM circuitry, SRAM circuitry, nonvolatile memory circuitry, analog circuitry and radio frequency circuitry.

The present invention may thus be described, in certain embodiments as a method of planarizing a surface of features of a substrate that is useful in making semiconductor devices, that includes etching a first trench, a second trench, and a third trench in the semiconductor substrate, wherein the first trench and the second trench are adjacent and separated by a first active region by a first distance, and the second trench and the third trench are adjacent and separated by a second active region by a second distance, the first distance being greater than the second distance; forming a first insulating layer over the first trench, the second trench, the third trench, the first active region, and the second region; and chemical/mechanical polishing the insulating layer to leave a non-planar surface over the first active region and a planar surface over the second active region.

Figure 1:
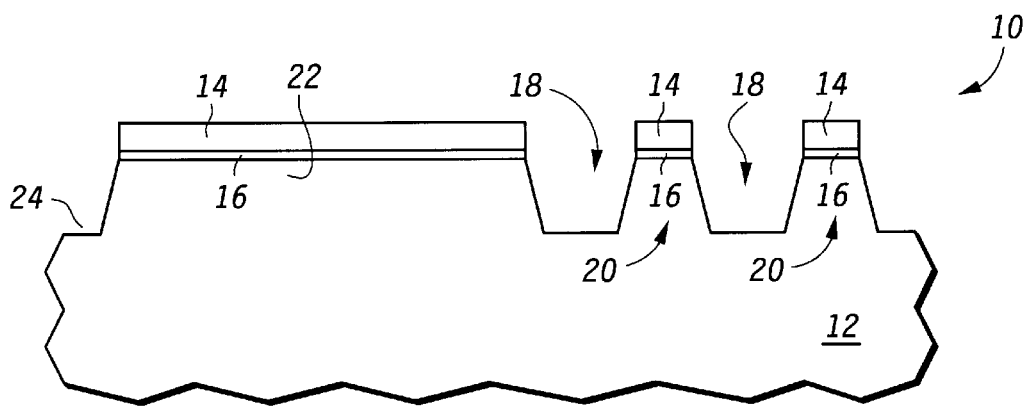
FIG. 1 is a cross-sectional schematic representation of a substrate in which active regions have been separated by trenches etched in the substrate.

As shown in the figures and in particular in FIG. 1, there is provided an active border 22 that surrounds the area to be polished. As shown in FIG. 1, the large active 22 is on the edge of the defined region, which would include a plurality of active areas separated by trenches, represented in the figure by active areas 20 separated by trenches 18. In a typical memory array, the actives 20 are longitudinal and the active border 22 would surround the actives on both sides as well as on the ends to completely enclose the defined region.

It is understood, however, that one may devise a substrate that includes gaps in the active border, or one may provide a substrate with a discontinuous border region and that such substrates or methods of processing such substrates would fall within the spirit and scope of the present invention as long as such a border provides for a planar chemical mechanical polish substantially at the edge of a defined region in such a substrate. The border is preferably made of the same material and is of substantially the same height as the active areas in the defined region and may provide a support for the pad used in the CMP process, thereby providing a uniform polish within the array. For example, in embodiments in which the active areas are doped to achieve certain electrical properties, the active border region may also be doped at substantially the same concentration. It is an embodiment of the invention that the active border that surrounds and may enclose the entire array is of greater width than each of the intended active areas of the array. The active border may be, for example, up to 2 times, 5 times or even 10 times wider than an intended active area within an array.

As shown in FIG. 1 a typical microelectronic or semiconductor device includes a substrate 12 which is typically a silicon or silicon on insulator (SOI) substrate 12, but may also be, in certain embodiments, a gallium arsenide or other Group III-IV material. In the manufacturing process of such a device an insulating layer, such as a layer of pad oxide 16 is first deposited on the surface of the substrate 12 and a polish stop 14 such as a layer of silicon nitride, silicon rich nitride, silicon oxynitride or composite films thereof is deposited on the pad oxide layer. It is understood that other materials such as polysilicon may be used as a polish stop in certain embodiments. Following this deposition the device 10 is patterned with a photo mask for example and etched to form trenches 18 which are adjacent to each other and which define the active regions 20 and a trench 24 which separates the array from the field area and which is adjacent to one of trenches 18. As shown in FIG. 1 the area 22 is the border active area which may be patterned to completely or substantially surround and enclose the array region. This border active area 22 as shown is of even height with the active areas 20 within the array, yet the border 22 is broader. In certain embodiments the active border area 22 may be ten times broader than the width of a single active area 20 and in certain embodiments may be two to five times the width, and in all preferred embodiments of the invention, the active border area 22 is wider than the width of an active region 20 within the defined region. Although the border may be as much as 10 times wider than an intended active region, it should be as narrow as possible to still achieve the beneficial effect. The active border is separated from the first active region 20 by a trench 18 that is substantially the same width as the trenches that occur between the active regions within the array.

Figure 2:
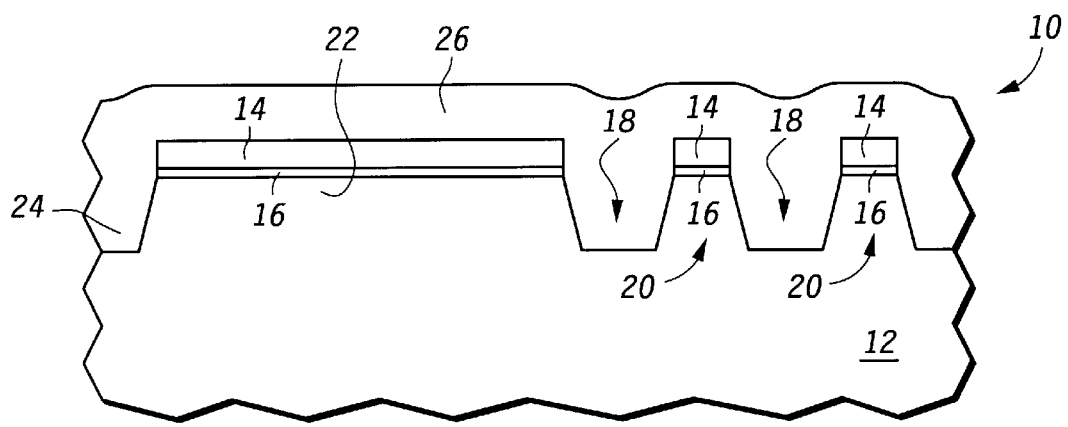
FIG. 2 is a cross-sectional schematic representation of the substrate of FIG. 1 after deposition of a dielectric material.

FIG. 2 illustrates the device 10 after a subsequent step in which a trench fill material, which is an insulating layer, 26 has been deposited on the surface of the device. The trench fill material 26 is typically a dielectric material such as an oxide or may also be an un-doped polysilicon material, but is preferably a silicon oxide. As seen in the figure the trench fill material 26 is deposited in an uneven manner in which the area over the active regions 20 of the array may project higher than the trench fill 26 over the trenches 18. It is this unevenness that necessitates the chemical mechanical polish step to achieve a planar surface over the substrate features.

Figure 3:
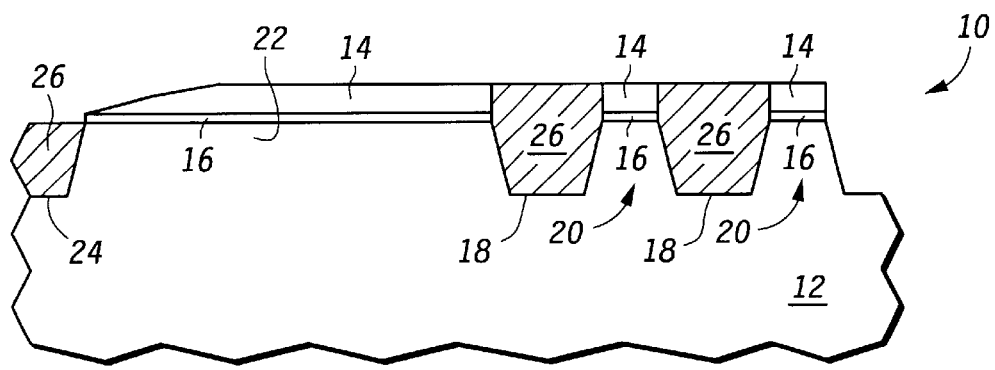
FIG. 3 is a cross-sectional schematic representation of the substrate of FIG. 2 after a chemical mechanical polish.

FIG. 3 is an illustration of the device 10 after the CMP step has been completed. As shown, the surface is planar over the trenches 18 and over the active regions 20, and the non-planar edge of the polished substrate is confined to the area above the active border area 22. Thus, because of the width of the active border 22 the eroded region is confined to the area above the active border 22 and as is illustrated in the figure does not extend into the area of the intended active areas 20 which have a planar surface.

Figure 4:
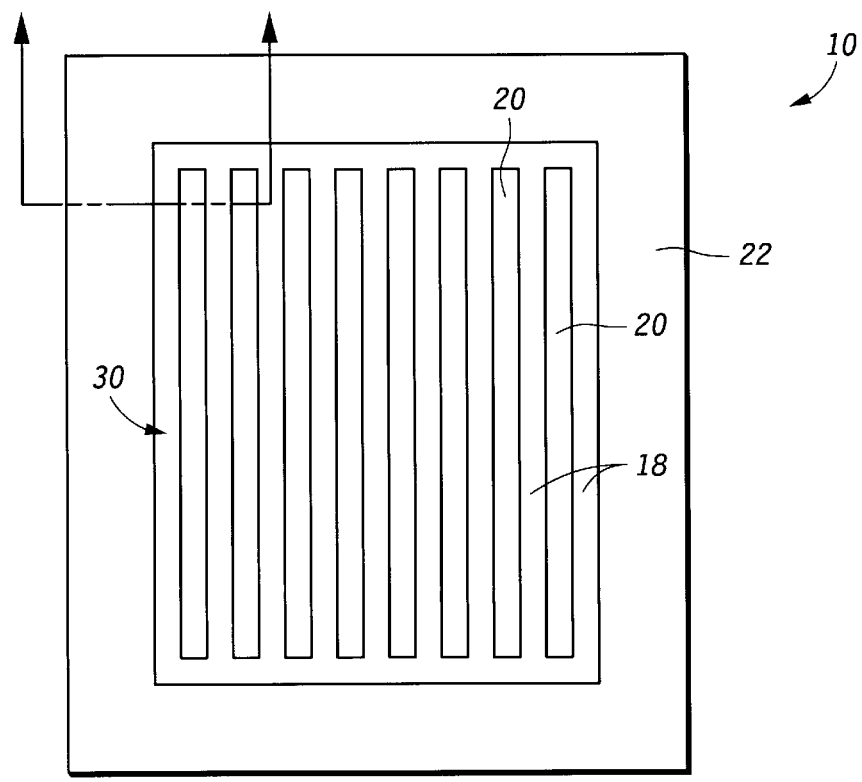
FIG. 4 is a top view of a schematic representation of a typical memory device containing longitudinal active areas separated by trenches.

FIG. 4 is a top view of device 10 in which is shown an active border region 22 that completely surrounds the defined array region 30. As illustrated, the active array region 30 contains longitudinal active areas 20 spaced apart by trenches 18. The active areas 20 are evenly spaced by the trenches 18 and as can be seen from the drawing, the trench between the active border 22 and the first active areas 20 and also the trench between the active border 22 and the ends of the active areas 20 are of the same width. As indicated in FIG. 4, a sectional view of the device 10 at the arrows is shown in FIGS. 1–3.

Figure 5:
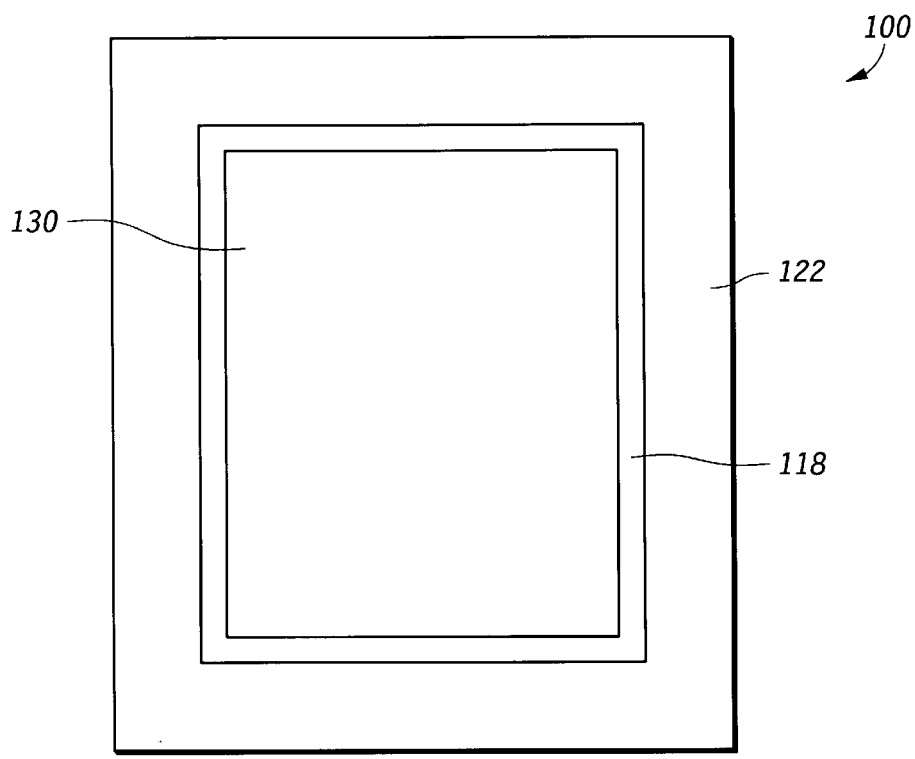
FIG. 5 is a top view of a schematic representation of a typical semiconductor device or array.

An alternate device 100 is shown in top view in FIG. 5. In FIG. 5 the active border area 122 surrounds the trench area 118 which encloses the active device 130. The region 130 may define any circuitry of common construction, or an area with a common electrical performance or similar behavior such as a memory array, but that does not necessarily include longitudinal active areas separated by trenches. Preferred devices as shown in FIG. 5 might include but are not limited to DRAM circuitry, SRAM circuitry, nonvolatile memory circuitry, analog circuitry and radio frequency circuitry. The device 100 may also be a chip, a transistor, or a die contained on a wafer.

Although the invention has been described in terms of preferred embodiments it is understood that one of skill in the art could apply this invention to other types of substrates or devices that require uniform polishing to achieve a uniform planar surface. For example, a device that included aluminum-copper wire circuitry on a substrate such as an interlevel dielectric substrate would also benefit from the common border area surrounding a device with said aluminum circuitry. Again the aluminum-copper or common material border would be spaced from the edge aluminum-copper wires the same distance as the internal spacing of the aluminum-copper wires and would be of a greater width than the internal aluminum-copper wires. For example, the border may be up to 2×, 5× or even 10× wider than the width of an internal aluminum-copper wire interconnect. In the practice of such an invention a conductive material such as aluminum-copper would be deposited on an oxide substrate and patterned and etched to achieve the aluminum-copper wire circuitry. Subsequently an oxide layer would be deposited over the aluminum-copper circuitry and polished to achieve a planar surface.

In a particular example of a preferred embodiment of the invention a typical memory array was fabricated, comprising active lines of dimension 0.21 micron spaced apart by trenches of 0.63 microns. This array was surrounded by an active boundary of 2.1 microns. This array was subjected to a chemical mechanical polish and sample cross-sectional analysis revealed an oxide topography with variations of only 2 nanometers from the array boundary to the first intended active, and no further variation from the first intended active to the 200$^{th}$ intended active near the center of the array. With this type of structure a dummy active line may or may not be required, but in any case, would not be required for its conventional purpose of achieving uniform electrical characteristics on the edge of the array.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor structure in a substrate comprising:
  a general region comprising a first plurality of longitudinal active regions having a length greater than a width over the substrate;
    a surrounding active region substantially surrounding the general region;
    a first trench substantially surrounding the surrounding active region;
    a second trench substantially surrounding the general region, wherein the first active region substantially surrounds the second trench and wherein the first trench and the second trench are adjacent and separated by the surrounding active region by at least a first distance; and
    a plurality of trenches in the semiconductor substrate in the region, the plurality of trenches being separated by the widths of the longitudinal active regions, the widths being less than a second distance;
    wherein the first distance is greater than the second distance.

2. The semiconductor structure of claim 1, further comprising insulating material in the first, second, and plurality of trenches.

3. The semiconductor structure of claim 1, further comprising circuitry in the region, wherein the circuitry is a non-volatile memory array.

4. The semiconductor structure of claim 1, further comprising circuitry in the region, wherein the circuitry is selected from a SRAM, DRAM, non-volatile memory array, analog circuitry, and radio frequency circuitry.

5. A semiconductor structure in a substrate, comprising;
  a region of common circuit construction in the substrate;
  a plurality of areas of first elevated regions of not greater than a first width within the region,
  a first depressed area that substantially surrounds the region,
  a second elevated region adjacent to and substantially surrounding the first depressed area and having a second width, wherein the second width is greater than the first width.

6. The semiconductor structure of claim 5, further comprising circuitry in the region, wherein the circuitry is a non-volatile memory array.

7. The semiconductor structure of claim 5, further comprising circuitry in the region, wherein the circuitry is selected from a SRAM, DRAM, non-volatile memory array, analog circuitry, and radio frequency circuitry.

8. The semiconductor structure of claim 5, wherein the first and second elevated areas comprise aluminum-copper.

9. The semiconductor structure of claim 5, wherein the first and second elevated areas comprise a layer of silicon oxide and a layer of silicon nitride.

10. The semiconductor structure of claim 5, further comprising a second depressed area substantially surrounding the second elevated region.

* * * * *